United States Patent
Joe

(10) Patent No.: US 10,088,529 B2
(45) Date of Patent: Oct. 2, 2018

(54) APPARATUS FOR ESTIMATING STATE OF HYBRID SECONDARY BATTERY AND METHOD THEREOF

(71) Applicant: LG CHEM, LTD., Seoul (KR)

(72) Inventor: Won-Tae Joe, Daejeon (KR)

(73) Assignee: LG CHEM, LTD., Seoul (KR)

( * ) Notice: Subject to any disclaimer, the term of this patent is extended or adjusted under 35 U.S.C. 154(b) by 204 days.

(21) Appl. No.: 15/028,974

(22) PCT Filed: Oct. 14, 2014

(86) PCT No.: PCT/KR2014/009647
§ 371 (c)(1),
(2) Date: Apr. 13, 2016

(87) PCT Pub. No.: WO2015/056964
PCT Pub. Date: Apr. 23, 2015

(65) Prior Publication Data
US 2016/0252583 A1    Sep. 1, 2016

(30) Foreign Application Priority Data

Oct. 14, 2013 (KR) .................. 10-2013-0122273
Oct. 13, 2014 (KR) .................. 10-2014-0137842

(51) Int. Cl.
  *G01R 31/36* (2006.01)
  *H01M 10/48* (2006.01)
  *H01M 16/00* (2006.01)

(52) U.S. Cl.
  CPC ..... *G01R 31/3651* (2013.01); *G01R 31/3624* (2013.01); *G01R 31/3662* (2013.01); *H01M 10/482* (2013.01); *H01M 16/00* (2013.01)

(58) Field of Classification Search
  CPC .............. G01R 31/3648; G01R 31/362; G01R 31/3662; G01R 31/3651; G01R 31/3679; G01R 31/3624; H01M 10/48
  See application file for complete search history.

(56) References Cited

U.S. PATENT DOCUMENTS

2004/0006440 A1    1/2004  Kim et al.
2006/0111870 A1    5/2006  Plett
(Continued)

FOREIGN PATENT DOCUMENTS

JP    2008-522153 A    6/2008
JP    2008-260346 A    10/2008
(Continued)

OTHER PUBLICATIONS

International Search Report issued in PCT/KR2014/009647 dated Jan. 21, 2015.

*Primary Examiner* — Douglas King
(74) *Attorney, Agent, or Firm* — Birch, Stewart, Kolasch & Birch, LLP

(57) ABSTRACT

An apparatus for estimating state of a hybrid secondary battery including a first secondary battery and a second secondary battery having different electrochemical characteristics from each other and being connected in parallel with each other, is provided. The apparatus includes a sensor unit which measures an operating voltage and an operating current of the secondary battery at time intervals, and a control unit which is electrically connected with the sensor unit and estimates the state of the hybrid secondary battery including at least one of a first state of charge of the first secondary battery and a second state of charge of the second secondary battery, by implementing an Extended Kalman Filter algorithm using a state equation and an output equation, in which the state equation includes, as a state parameter, at least one of the first state of charge of the first (Continued)

secondary battery and the second state of charge of the second secondary battery, and the output equation includes, as an output parameter, the operating voltage of the hybrid secondary battery.

22 Claims, 3 Drawing Sheets

(56) References Cited

U.S. PATENT DOCUMENTS

| | | | |
|---|---|---|---|
| 2009/0001992 A1 | 1/2009 | Tsuchiya | |
| 2009/0189613 A1 | 7/2009 | Plett | |
| 2009/0261837 A1 | 10/2009 | Plett | |
| 2013/0038289 A1* | 2/2013 | Tse | H02M 3/158 320/118 |
| 2013/0106355 A1* | 5/2013 | Kim | H02J 7/0013 320/118 |
| 2013/0110429 A1 | 5/2013 | Mitsuyama et al. | |
| 2014/0074416 A1 | 3/2014 | Park et al. | |
| 2014/0087227 A1* | 3/2014 | Shih | H01M 2/0277 429/99 |
| 2015/0118542 A1* | 4/2015 | Lee | H01M 4/505 429/156 |

FOREIGN PATENT DOCUMENTS

| | | |
|---|---|---|
| JP | 2012-47491 A | 3/2012 |
| JP | 2012-057998 A | 3/2012 |
| KR | 10-2004-0003336 A | 1/2004 |
| KR | 10-2008-0041702 A | 5/2008 |
| KR | 10-0996693 B1 | 11/2010 |
| KR | 10-2013-0105123 A | 9/2013 |

\* cited by examiner

APPARATUS FOR ESTIMATING STATE OF HYBRID SECONDARY BATTERY AND METHOD THEREOF

TECHNICAL FIELD

The present disclosure relates to an apparatus and a method for estimating voltage of a hybrid secondary battery, using Extended Kalman Filter.

The present application claims the benefit of Korean Patent Application No. 10-2013-0122273 filed on Oct. 14, 2013 with the Korean Intellectual Property Office, the disclosure of which is incorporated herein by reference in its entirety. Additionally, the present application claims the benefit of Korean Patent Application No. 10-2014-0137842 filed on Oct. 13, 2014 with the Korean Intellectual Property Office, the disclosure of which is incorporated herein by reference in its entirety.

BACKGROUND ART

Batteries, which generate electrical energy by way of electrochemical oxidation and reduction, are used over a wide range of applications. For example, the batteries are used in gradually expanding fields, including: devices carried around in user's hands, such as portable phones, laptop computers, digital cameras, video camera, tablet computers, electrically-driven tools, and so on; electrically-driven apparatuses such as electric bicycles, electric auto-bicycles, electric vehicles, hybrid vehicles, electric boats, electric airplanes, and so on; power storage apparatuses for use in storing electricity generated from renewable energy or surplus generated electricity; or uninterruptable power supply to stably supply electricity to a variety of information communication apparatuses including server computer, base station for communication, and so on.

The battery includes three basic elements which are: a negative electrode containing a material that undergoes oxidation and releases electrons during discharging; a positive electrode containing a material that undergoes reduction and accepts electrons during discharging; and an electrolyte that allows migration of operating ions between the negative electrode and the positive electrode.

The battery can be categorized into a primary battery which is not reusable once it is discharged, and a secondary battery which has at least partially reversible electrochemical reaction, thus are repetitively chargeable and dischargeable.

For the secondary battery, lead-acid battery, nickel-cadmium battery, nickel-zinc battery, nickel-iron battery, silver oxide battery, nickel metal hydride battery, zinc-manganese oxide battery, zinc-bromide battery, metal-air battery, lithium secondary battery, and so on, are known.

Among these, the lithium secondary battery is attracting greatest commercial attentions, in view of its relatively higher energy density, higher battery voltage and longer storage life than the other secondary batteries.

Concerning the secondary battery, materials used for positive electrode material and negative electrode material have critical influence on the performance of the secondary battery. Accordingly, a variety of efforts are being made to provide the positive electrode material and the negative electrode material which have stability at high temperature and can provide high energy capacity and low manufacture cost.

However, it will not be easy to develop a positive electrode material and a negative electrode material that have superior performances in all aspects. Therefore, attempts are recently made to make up for the shortcomings of respective secondary batteries by way of connecting in parallel the secondary batteries that include different types of positive electrode materials and negative electrode materials from each other.

Hereinbelow, the secondary battery formed by connecting different types of secondary batteries in parallel will be referred to as a 'hybrid secondary battery'.

Meanwhile, the hybrid secondary battery often has a voltage profile that includes a point of inflection, when the constituent batteries have different operating voltage ranges from one another. This is because, when the constituent batteries have different operating voltage ranges, dominant reaction kinetics will change during charging or discharging of the hybrid secondary battery.

Meanwhile, when the voltage profile of the hybrid secondary battery has a point of inflection, the state of charge changes considerably even with a slight voltage variation. Accordingly, directly using voltage to estimate the state of charge of the hybrid secondary battery near the point of inflection is accompanied with a disadvantage of increasing state of charge estimation error.

For reference, the state of charge is known in the art as the State of Charge (SOC) parameter. The values of the state of charge may be expressed by quantitative representation with parameters SOC and z. The state of charge can be expressed with the parameter SOC as percentage (0 to 100%), and can be expressed with parameter z as a number (0 to 1). Generally, the state of charge may be measured with ampere counting method.

Accordingly, the technical field of the present disclosure demands new ways to estimate the state of charge of a hybrid secondary battery.

DISCLOSURE

Technical Problem

The present disclosure is designed to solve the problems of the related art, and therefore the present disclosure is directed to providing an apparatus and a method for estimating a state of a hybrid secondary battery in which secondary batteries with different electrochemical characteristics from each other are connected in parallel, using Extended Kalman Filter.

Technical Solution

According to the present disclosure, there is provided an apparatus for estimating a state of a hybrid secondary battery, which estimates the state of the hybrid secondary battery including a first secondary battery and a second secondary battery having different electrochemical characteristics from each other and being connected in parallel with each other, using Extended Kalman Filter.

According to the present disclosure, the 'state' of the hybrid secondary battery refers to a parameter which cyclically changes during charging or discharging.

According to one aspect, the voltage or the state of charge of a hybrid secondary battery has cyclic variation characteristic of increasing and then decreasing within a predetermined range according to charging and discharging. Accordingly, the voltage and the state of charge are included as the state parameters that indicate the state of the hybrid secondary battery.

According to another aspect, the states of charge of the first secondary battery and the second secondary battery included in the hybrid secondary battery are also included as the state parameters that indicate the state of the hybrid secondary battery.

For example, as the hybrid secondary battery is charged or discharged, the states of charge of the first secondary battery and the second secondary battery also change cyclically. Accordingly, the state of charge of the first secondary battery and the state of charge of the second secondary battery may also be included as the parameters indicating the state of the hybrid secondary battery.

According to the present disclosure, the 'electrochemical characteristic' as used herein refers to at least one of battery capacity, battery use voltage range, maximum/minimum battery charge rate or maximum/minimum battery discharge rate according to state of charge, low rate discharge characteristic, high rate discharge characteristic, temperature-based maximum/minimum charge rate or maximum/minimum discharge rate, charge or discharge profile, resistance profile according to state of charge variation, open-circuit voltage profile according to state of charge variation, and dQ/dV distribution indicating capacity characteristic of battery with respect to voltage.

Preferably, in order to have different electrochemical characteristics from each other, the first secondary battery and the second secondary battery may have at least one difference in a positive electrode material, a negative electrode material, or an electrolyte.

Preferably, the first and the second secondary batteries may be lithium secondary batteries in which an electrochemical reaction is caused by the lithium ions.

Preferably, the apparatus for estimating the state of the hybrid secondary battery may include (i) a sensor unit which measures operating voltage and operating current of the hybrid secondary battery at time intervals, and (ii) a control unit electrically connected with the sensor unit, and estimates the state of the hybrid secondary battery including a state of charge of at least one of the first secondary battery and the second secondary battery, by implementing an Extended Kalman Filter algorithm using a state equation including, as a state parameter, the state of charge of at least one of the first secondary battery and the second secondary battery, and an output equation including, as an output parameter, the voltage of the hybrid secondary battery.

Preferably, the state equation and the output equation are derived from a circuit model, and the circuit unit may include a first circuit unit and a second circuit unit corresponding to the first secondary battery and the second secondary battery, respectively, and connected in parallel with each other.

According to one aspect, the first circuit unit includes a first open-circuit voltage element and optionally, a first impedance element, and simulates the voltage variation of the first secondary battery by the first open-circuit voltage element and the first impedance element.

In one example, the first open-circuit voltage element forms open-circuit voltage according to the state of charge of the first secondary battery, and the first impedance element forms impedance voltage according to current flowing through the first circuit unit.

Hereinbelow, the state of charge of the first secondary battery will be referred to as a 'first state of charge', the voltage formed by the first open-circuit voltage element will be referred to as a 'first open-circuit voltage', the current flowing through the first circuit unit will be referred to as a 'first current', and the voltage formed by the circuit elements included in the first impedance voltage element will be referred to as a 'first impedance voltage'.

According to another aspect, the second circuit unit includes a second open-circuit voltage element and optionally, a second impedance element, and simulates the voltage variation of the second secondary battery by the second open-circuit voltage element and the second impedance element.

In one example, the second open-circuit voltage element forms open-circuit voltage according to the state of charge of the second secondary battery, and the second impedance element forms impedance voltage according to current flowing through the second circuit unit.

Hereinbelow, the state of charge of the second secondary battery will be referred to as a 'second state of charge', the voltage formed by the second open-circuit voltage element will be referred to as a 'second open-circuit voltage', the current flowing through the second circuit unit will be referred to as a 'second current', and the voltage formed by the circuit elements included in the second impedance element will be referred to as a 'second impedance voltage'.

Preferably, the first open-circuit voltage may be determined based on a pre-defined correlation between the first state of charge and the first open-circuit voltage. Further, the second open-circuit voltage may be determined based on a pre-defined correlation between the second state of charge and the second open-circuit voltage.

According to the present disclosure, the pre-defined correlations may be obtained from open-circuit voltage profiles which are measured per state of charge of the first secondary battery and the second secondary battery, respectively.

According to one aspect, the pre-defined correlation may be a look-up table which may map the corresponding open-circuit voltage per state of charge.

The look-up table may be obtained by using open-circuit voltage data which is measured per state of charge regarding the first and the second secondary batteries.

According to another aspect, the pre-defined correlation may be a look-up function which may include the state of charge and the open-circuit voltage as an input parameter and an output parameter, respectively.

The look-up function may be obtained by the numerical analysis of coordinate data which constructs the open-circuit voltage profile measured per state of charge regarding the first and the second secondary batteries.

According to the present disclosure, the state parameter may include at least one selected from among voltage formed by the circuit elements included in the first impedance element, and voltage formed by the circuit elements included in the second impedance element.

According to one aspect, the state equation may include, as input parameters, a first current and a second current.

Preferably, the control unit may time-update the first current and the second current every time a predetermined time elapses, using a first current distribution equation and a second current distribution equation derived from current analysis of the circuit model, and the operating current measured by the sensor unit.

According to another aspect, the output equation is derived from the voltage analysis of the circuit model, and may include a plurality of input parameters.

Preferably, the plurality of input parameters may include: (i) operating current of the hybrid secondary battery measured by the sensor unit; (ii) the first open-circuit voltage; (iii) the second open-circuit voltage; (iv) optionally, the first impedance voltage; and (v) optionally, the second impedance voltage.

According to one aspect, the state equation may be defined such that the first state of charge and the second state of charge are time-updated by adding up the first current flowing through the first circuit unit and the second current flowing through the second circuit unit according to time.

In the above example, the control unit may time-update the first state of charge and the second state of charge, by implementing [state estimate time update] of the Extended Kalman Filter algorithm, by using the state equation.

According to another aspect, the state equation may be defined such that the first impedance voltage is varied according to time, by a first impedance voltage formula derived from circuit analysis of the first impedance element. Further, the state equation may be defined such that the second impedance voltage is varied according to time, by a second impedance voltage formula derived from circuit analysis of the second impedance element.

In the above example, the control unit may time-update the first impedance voltage and the second impedance voltage, by implementing [state estimate time update] of the Extended Kalman Filter algorithm, by using the state equation.

Preferably, the first impedance voltage formula and the second impedance voltage formula may time-update the voltage formed by at least one or more RC circuits connected in series.

Preferably, the control unit may implement an [error covariance time update] of the Extended Kalman Filter algorithm, by using Jacobian matrices derived from the state equation.

Further, the control unit may estimate the operating voltage of the hybrid secondary battery as an output parameter, by implementing [output estimation] of the Extended Kalman Filter algorithm, by using the output equation.

Further, the control unit may implement [Kalman gain determination] of the Extended Kalman Filter algorithm, by using the Jacobian matrices derived from the output equation, and the time-updated error covariance.

Further, the control unit may implement [state estimate measurement update] of the Extended Kalman Filter algorithm, by reflecting the determined Kalman gain to a difference between the measured operating voltage of the hybrid secondary battery and the operating voltage of the hybrid secondary battery estimated by the output equation.

Further, the control unit may implement [error covariance measurement update] of the Extended Kalman Filter algorithm, by using the time-updated error covariance and the determined Kalman gain.

Preferably, the state equation and the output equation may each include a process noise and a sensor noise.

According to the present disclosure, the control unit may estimate the state of charge of the hybrid secondary battery, by using the first state of charge and the second state of charge.

According to one aspect, the first impedance element and/or the second impedance element may include at least one resistor, at least one capacitor, at least one inductor, or a combination thereof.

Preferably, the first impedance element and/or the second impedance element may include at least one RC circuit in which a resistor and a capacitor are connected in parallel, and optionally, a resistor connected in series with the same.

Preferably, the first open-circuit voltage element and the first impedance element, and the second open-circuit voltage element and the second impedance element may be connected in series.

The control unit may be a battery management system (BMS) which may be electrically coupled with the hybrid secondary battery, or a control element included in the BMS.

The battery management system described above may refer to a system that is called BMS in the technical field pertinent to the present disclosure, but from the perspective of functions, the battery management system may include in its scope any system as long as the system performs at least one function as described herein.

The battery management system may include the circuit model as a software algorithm implementable by a processor. In one example, the circuit model may be written as program codes and stored in a memory device, and implemented by the processor.

The present disclosure provides a method for estimating state of a hybrid secondary battery including a first secondary battery and a second secondary battery having different electrochemical characteristics from each other and being connected in parallel with each other.

First, at time intervals, a step of measuring operating voltage and operating current of the hybrid secondary battery is performed.

Next, the state of the hybrid secondary battery including at least one of the first state of charge and the second state of charge is estimated, by implementing an Extended Kalman Filter algorithm using a state equation and an output equation, in which the state equation includes at least one of the first state of charge and the second state of charge as an input parameter, and the output equation includes the operating voltage of the hybrid secondary battery as an output parameter.

The state equation and the output equation are derived from a circuit model, in which the circuit model may include: (i) a first circuit unit including a first open-circuit voltage element corresponding to the first secondary battery, and optionally, a first impedance element, to simulate voltage variation of the first secondary battery; (ii) a second circuit unit connected in parallel with the first circuit unit, and including a first open-circuit voltage element corresponding to the second secondary battery, and optionally, a second impedance element to simulate voltage variation of the second secondary battery.

The technical objects of the present disclosure may also be achieved by a computer-readable recording medium recording therein a program of implementing the method for estimating state of a hybrid secondary battery according to the present disclosure.

Advantageous Effects

The present disclosure gives the following effects. According to one aspect of the present disclosure, the state of a hybrid secondary battery can be estimated conveniently, by using recursive algorithm of the Extended Kalman Filter algorithm derived from a circuit model.

According to another aspect of the present disclosure, the state of the hybrid secondary battery having a voltage profile including a point of inflection can be estimated with accuracy, even in a state-of-charge range particularly near the point of inflection.

According to yet another aspect of the present disclosure, since the state of the hybrid secondary battery can be estimated with convenience, it is possible to provide a hybrid secondary battery with optimum combination of secondary batteries that suits the purpose of use.

According to yet another aspect of the present disclosure, it is possible to provide a secondary battery which can satisfy a variety of specifications as required by emerging application fields including electric vehicles, power storage apparatuses, and so on.

DESCRIPTION OF DRAWINGS

The accompanying drawings illustrate preferred embodiments of the present disclosure and, together with the foregoing disclosure, serve to provide further understanding of the technical features of the present disclosure. However, the present disclosure is not to be construed as being limited to the drawings.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, and not intended to limit the scope of the disclosure, so it should be understood that other equivalents and modifications could be made thereto without departing from the spirit and scope of the disclosure.

Figure 1:
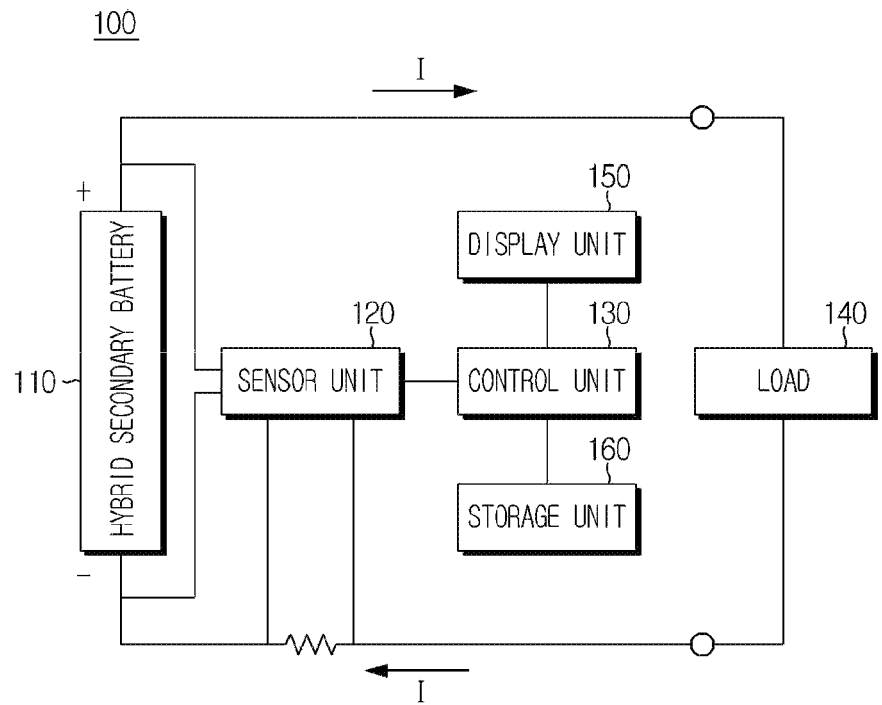
FIG. 1 is a block diagram schematically illustrating a configuration of an apparatus for estimating a state of a hybrid secondary battery according to an embodiment of the present disclosure.

FIG. 1 is a block diagram schematically illustrating a configuration of an apparatus 100 for estimating a state of a hybrid secondary battery according to an embodiment of the present disclosure.

As illustrated in the drawing, the apparatus 100 includes a sensor unit 120 and a control unit 130, and is electrically connected with the hybrid secondary battery 110, thereby to estimate the state of the hybrid secondary battery 110.

The hybrid secondary battery 110 includes at least a first secondary battery and a second secondary battery, both connected in parallel with each other and having different electrochemical characteristics from each other.

According to the present disclosure, the 'electrochemical characteristic' as used herein refers to at least one selected from among battery capacity, battery use voltage range, maximum/minimum battery charge rate or maximum/minimum battery discharge rate according to state of charge, low rate discharge characteristic, high rate discharge characteristic, temperature-based maximum/minimum charge rate or maximum/minimum discharge rate, charge or discharge profile, resistance profile according to state of charge variation, open-circuit voltage profile according to state of charge variation, and dQ/dV distribution representing capacity characteristic of battery with respect to voltage.

Preferably, the first and the second secondary batteries may be lithium secondary batteries, in which an electrochemical reaction is caused by the lithium ions. However, the present disclosure is not limited to a specific type of secondary battery. Accordingly, any type of a hybrid secondary battery may fall under the scope of the present disclosure, as long as there are two secondary batteries having different electrochemical characteristics from each other.

Preferably, in order to have different electrochemical characteristics from each other, the first secondary battery and the second secondary battery may have difference at least in a positive electrode material, a negative electrode material, or an electrolyte.

According to one embodiment, the first secondary battery may include, as a positive electrode material, an alkali metal compound expressed by general chemical formula $A[A_xM_y]O_{2+z}$ (where, A includes at least one or more from among Li, Na and K; M includes at least one or more selected from among Ni, Co, Mn, Ca, Mg, Al, Ti, Si, Fe, Mo, V, Zr, Zn, Cu, Al, Mo, Sc, Zr, Ru, and Cr; $x \geq 0$, $1 \leq x+y \leq 2$, $-0.1 \leq z \leq 2$; and x, y, z, and stoichiometric coefficients of components contained in M are so selected that the compound maintains electric neutrality).

Alternatively, the first secondary battery may include, as the positive electrode material, the alkali metal compound $xLiM^1O_2\text{-}(1-x)Li_2M^2O_3$ (where, $M^1$ includes at least one or more elements having a mean oxidation state of 3; $M^2$ includes at least one or more elements having a mean oxidation state of 4; and $0 \leq x \leq 1$), as disclosed in U.S. Pat. No. 6,677,082, U.S. Pat. No. 6,680,143, and so on.

Further, the second secondary battery may include, as the positive electrode material, lithium metal phosphate expressed by general chemical formula $Li_aM^1_xFe_{1-x}M^2_yP_{1-y}M^3_zO_{4-z}$ (where $M^1$ includes at least one or more elements selected from among Ti, Si, Mn, Co, Fe, V, Cr, Mo, Ni, Nd, Mg and Al; $M^2$ includes at least one or more elements selected from among Ti, Si, Mn, Co, Fe, V, Cr, Mo, Ni, Nd, Mg, Al, As, Sb, Si, Ge, V and S; $M^3$ includes at least one or more elements selected from a halogen group including F; $0<a \leq 2$, $0 \leq x \leq 1$, $0 \leq y<1$, $0 \leq z<I$; a, x, y, z and stoichiometric coefficient of components contained in $M^1$, $M^2$, and $M^3$ are so selected that the compound maintains electric neutrality), or $Li_3M_2(PO_4)_3$ [where, M includes at least one or more elements selected from among Ti, Si, Mn, Fe, Co, V, Cr, Mo, Ni, Mg and Al].

Optionally, the positive electrode material included in the first and/or the second secondary batteries may include a coating layer. The coating layer may include a carbon layer, or may include an oxide layer or a fluoride layer including at least one or more elements selected from the group consisting of Ti, Si, Mn, Co, Fe, V, Cr, Mo, Ni, Nd, Al, Mg, As, Sb, Si, Ge, V and S.

Further, the first and the second secondary batteries may include different types of negative electrode materials in the negative electrode to have different electrochemical characteristics from each other. The negative electrode material may include carbon material, lithium metal, silicon or tin, or a metal oxide such as $TiO_2$, $SnO_2$ having electric potential of less than 2 V. For the carbon material, the low-crystalline carbon and the high-crystalline carbon may be used. The representative example of the low-crystalline carbon includes soft carbon and hard carbon, and the representative example of the high-crystalline carbon includes high-temperature sintered carbon such as natural graphite, artificial graphite, Kish graphite, pyrolytic carbon, mesophase pitch based carbon fiber, meso-carbon microbeads, mesophase pitches, petroleum derived cokes, tar pitch derived cokes, and so on.

Further, the first and/or the second secondary batteries may include different types of electrolytes to have different electrochemical characteristics from each other, and the electrolyte may include salt with a structure such as $A^+B^-$. In the above structure, $A^+$ includes alkali metal cation such as $Li^+$, $Na^+$, $K^+$, or ions consisting of a combination thereof. $B^-$ includes one or more anion selected from the group consisting of $F^-$, $Cl^-$, $Br^-$, $I^-$, $NO_3^-$, $N(CN)_2^-$, $BF_4^-$, $ClO_4^-$, $AlO_4^-$, $AlCl_4^-$, $PF_6^-$, $SbF_6^-$, $AsF_6^-$, $BF_2C_2O_4^-$, $BC_4O_8^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $C_4F_9SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $(CF_3SO_2)_3C^-$, $CF_3(CF_2)_7SO_3^-$, $CF_3CO_2^-$, $CH_3CO_2^-$, $SCN^-$ and $(CF_3CF_2SO_2)_2N^-$.

Further, the electrolyte may include organic solvent. For the organic solvent, propylene carbonate (PC), ethylenecarbonate (EC), diethyl carbonate (DEC), dimethyl carbonate (DMC), dipropyl carbonate (DPC), dimethyl sulfoxide, acetonitrile, dimethoxyethane, diethoxyethane, tetrahydrofuran, N-methyl-2-pyrrolidone (NMP), ethyl methyl carbonate (EMC), γ-butyrolactone or a mixture thereof may be used.

According to the present disclosure, as long as the first secondary battery and the second secondary battery have different electrochemical characteristics and are connected in parallel with each other, the configuration thereof is not limited to a packaging form of the respective secondary batteries and the number of unit cells of the respective secondary batteries.

Further, the first secondary battery and the second secondary battery will have to be understood as a concept that encompasses not only a unit cell but also an assembly of a plurality of battery elements such as a module including a plurality of unit cells, a pack including a plurality of modules, and so on.

Figure 2:
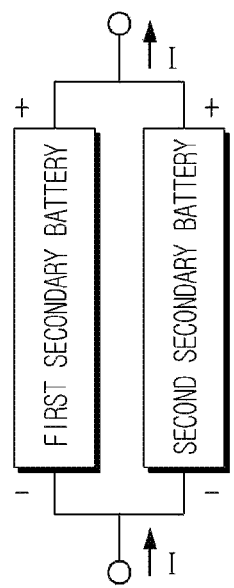
FIG. 2 is a conceptual diagram illustrating an example in which a first secondary battery and a second secondary battery packaged in different packing members from each other are connected in parallel.
Figure 3:
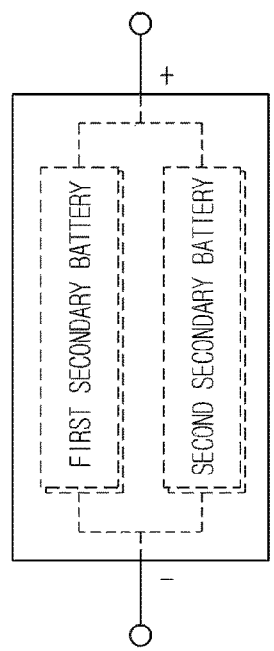
FIG. 3 is a conceptual diagram illustrating an example in which a first secondary battery and a second secondary battery packaged in one packing member are connected in parallel therein.

According to one aspect, the first secondary battery and the second secondary battery are batteries independently packaged in different packing members as shown in FIG. 2, or packaged together in one packing member as shown in FIG. 3.

In one example, the first and the second secondary batteries may be different types of lithium secondary batteries packaged in ductile pouch packing members individually. Alternatively, the first and the second secondary batteries may be different types of lithium secondary batteries packaged together in one pouch packing member. Further, when different types of first and second unit cells are stacked alternately and connected in parallel in one packing member, the first unit cell group and the second unit cell groups in alternate stack may be considered as corresponding to the first secondary battery and the second secondary battery, respectively.

The first unit cell and the second unit cell include, at least, a positive plate and a negative plate, and a separator interposed therebetween. The first unit cell and the second unit cell have different electrochemical characteristics. Accordingly, the positive plates and/or the negative plates of the first unit cell and the second unit cell may include coating layers of different active materials from each other.

According to another aspect, the first secondary battery and the second secondary battery may include at least one unit cell including a negative electrode/a separator/a positive electrode as a minimum unit, or an assembly of unit cells in which at least two or more unit cells are connected in series and/or in parallel and stacked.

According to yet another aspect, the first secondary battery may include a secondary battery module in which a plurality of secondary batteries having a first electrochemical characteristic and being packaged individually are connected in series and/or in parallel. Similarly, the second secondary battery may include a secondary battery module in which a plurality of secondary batteries having a second electrochemical characteristic and being packaged individually are connected in series and/or in parallel.

The hybrid secondary battery 110 may be electrically connected with a load 140. The load 140 is included in the variety of electrically-driven apparatuses, and it refers to an energy consuming device included in the electrically-driven apparatuses and operating on electrical energy supplied during discharging of the secondary battery 110.

The electrically-driven apparatuses may be, for example: an electrically-driven moving apparatus such as electric vehicle (EV), hybrid electric vehicle (HEV), plug-in hybrid electric vehicle (PHEV) or E-bike; a hand-held device such as mobile phone, smartphone or smart pad; a movable computer such as laptop computer; a movable image photographing device such as camcorder or digital camera; or a large-capacity energy storage system (ESS) for use at power grid or uninterrupted power supply, but not limited thereto.

The load 140 may be, without limitation, a rotary power apparatus such as a motor, a power converting apparatus such as an inverter, and so on, although the present disclosure is not limited to a specific type of the load.

Additionally, the apparatus 100 may optionally further include a storage unit 160. The storage unit 160 is not limited to any specific type of storage medium as long as it can record and erase information. In one example, the storage unit 160 may be RAM, ROM, register, hard disk, optical recording medium, or magnetic recording medium. Further, the storage unit 160 may be connected with the control unit 130 via, for example, data bus, and so on, to allow access by the control unit 130. The storage unit 160 stores and/or updates and/or erases and/or transmits program including various control logics implemented by the control unit 130 and/or the data that is generated when the control logics are implemented. The storage unit 160 is logically dividable into two or more, and included in the control unit 130 without limitation.

Additionally, the apparatus 100 may optionally further include a display unit 150. The display unit 150 is not limited to any specific type, as long as it can display information generated by the control unit 130 as graphic interface. In one example, the display unit 150 may be a liquid crystal display, an LED display, an OLED display, an E-INK display, a flexible display, and so on. The display unit 150 may be connected with the control unit 130 directly or indirectly. In the latter case, the display unit 150 may be located at an area physically separated from an area where the control unit 130 is located. Further, a third-party control unit (not illustrated) may be disposed between the display unit 150 and the control unit 130, in which case the third-party control unit may receive from the control unit 130 information to be displayed on the display unit 150 and display the received information on the display unit 150. To this purpose, the third-party control unit and the control unit 130 may be connected via communication interface.

Under the control of the control unit 130, the sensor unit 120 may repeatedly measure the operating current I and the operating voltage V applied to the negative electrode and the positive electrode of the hybrid secondary battery 110 at time intervals, and output the measured operating voltage V and operating current I to the control unit 130. In this case, the operating voltage V and the operating current I may be measured at the same time point or at different time points.

The sensor unit 120 may include a voltage measuring means and a current measuring means. The voltage measuring means may be configured as a circuit which measures the voltage of the hybrid secondary battery 110 based on a reference electric potential. The current measuring means may be configured as a sense resistor which is installed on a line where a charge current or a discharge current flows. However, the present disclosure is not limited to specific configurations of the voltage measuring means and the current measuring means.

The voltage measuring means and the current measuring means may be included in one sensor unit 120, but may be separated from each other physically. In such example, the sensor unit 120 will have to be understood as a concept that includes a voltage measuring means and a current measuring means separated from each other.

The control unit 130 is a constituent element that can implement at least one or more control logics necessary for estimating the state of the hybrid secondary battery 110 using the Extended Kalman Filter which, in a non-limiting example, may be pre-defined as a software implementing Extended Kalman Filter algorithm.

In order to apply the Extended Kalman Filter in the state estimation of the hybrid secondary battery 110, it is necessary to define the state equation and the output equation by considering the hybrid secondary battery 110 as one system.

In a preferred embodiment, the state equation and the output equation may be derived from a circuit model. The circuit model may include at least one or more circuit units which are connected in series and/or in parallel to simulate voltage variation of the hybrid secondary battery 110.

Figure 4:
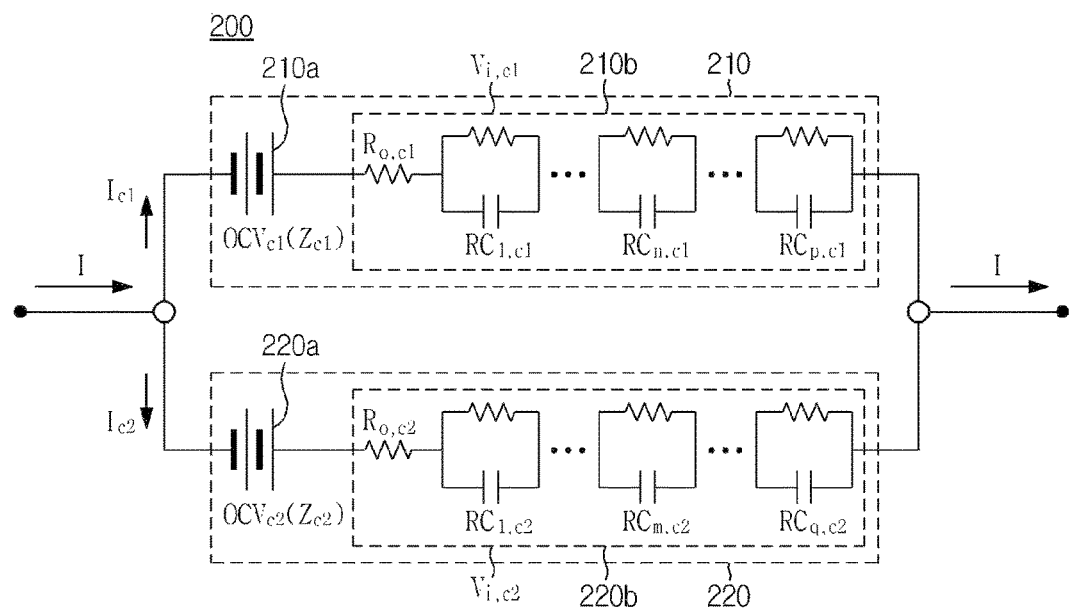
FIG. 4 is a circuit diagram illustrating a circuit model according to an embodiment of the present disclosure.

FIG. 4 illustrates a circuit model 200 according to an embodiment of the present disclosure, from which the state equation and the output equation of the Extended Kalman Filter can be derived.

Referring to FIG. 4, in order to model the voltage variation of the hybrid secondary battery 110, the circuit model 200 includes a first circuit unit 210 and a second circuit unit 220 connected in parallel.

The first circuit unit 210 is provided to simulate the voltage variation of the first secondary battery, and it includes a first open-circuit voltage element 210a and, optionally, a first impedance element 210, both of which may be connected in series with each other.

Similarly, the second circuit unit 220 is provided to simulate the voltage variation of the second secondary battery, and it includes a second open-circuit voltage element 220a and, optionally, a second impedance element 220b, both of which may be connected in series with each other.

During the hybrid secondary battery 110 charging or discharging, the first open-circuit voltage $OCV_{c1}(z_{c1})$, varying in magnitude by the first state of charge $z_{c1}$ of the first secondary battery, is formed at both ends of the first open-circuit voltage element 210a, and the second open-circuit voltage $OCV_{c2}(z_{c2})$, varying in magnitude by the second state of charge $z_{c2}$, is formed at both ends of the second open-circuit voltage element 220a.

The first state of charge $z_{c1}$ and the second state of charge $z_{c2}$ have a value between 0 and 1, and gradually increase from 0 to 1 during the hybrid secondary battery 110 charging, and gradually decrease from 1 to 0 during the hybrid secondary battery 110 discharging.

However, because of the different electrochemical characteristics of the first secondary battery and the second secondary battery from each other, the first state of charge $z_{c1}$ and the second state of charge $z_{c2}$ show different variation speeds according to the state of charge of the hybrid secondary battery 110.

For example, the first state of charge $z_{c1}$ may change faster than the second state of charge $z_{c2}$ when the hybrid secondary battery 110 is in a specific state-of-charge range, and vice versa in the other state-of-charge range.

Preferably, the first open-circuit voltage $OCV_{c1}(z_{c1})$ may be determined based on pre-defined correlation between the first state of charge $z_{c1}$ and the corresponding open-circuit voltage of the first secondary battery.

Similarly, the second open-circuit voltage $OCV_{c2}(z_{c2})$ may be determined based on pre-defined correlativity between the second state of charge $z_{c2}$ and the corresponding open-circuit voltage of the second secondary battery.

Preferably, the pre-defined correlation may be obtained from an open-circuit voltage profile which is measured per state of charge of the first secondary battery and the second secondary battery.

According to one embodiment, the pre-defined correlation may be a look-up table which may map the open-circuit voltage corresponding to each state of charge. Such look-up table may be obtained by using open-circuit voltage data which is measured per state of charge regarding the first and the second secondary batteries.

According to another embodiment, the pre-defined correlation may be a look-up function which may include the state of charge and the open-circuit voltage as an input parameter and an output parameter, respectively. Such look-up function may be obtained by the numeric analysis of coordinate data included in the open-circuit voltage profile which is measured per state of charge regarding the first and the second secondary batteries.

Preferably, the first impedance element 210b and the second impedance element 220b may each include at least one circuit element to simulate IR voltage and/or polarization voltage which are generated during operation of the first secondary battery and the second secondary battery.

The 'IR voltage' as used herein refers to voltage generated by internal resistance of the secondary battery during the secondary battery charging or discharging.

Due to the IR voltage, the voltage of the secondary battery is higher than the open-circuit voltage during secondary battery charging, and is lower during secondary battery discharging.

The number and types of the circuit elements included in the first impedance element 210b and the second impedance element 220b, and connection relation among the circuit elements may be determined according to electrochemical properties of the first secondary battery and the second secondary battery, and preferably, may be determined through the trial and error involving AC impedance measurement test. Further, the electrical characteristic values of the respective circuit elements may be adjusted to optimum values by setting approximate values with the AC impedance measurement test, and then minimizing, by tuning, the error between the state of the hybrid secondary battery estimated according to the present disclosure and the state measured under accurate test conditions.

According to one aspect, the first impedance element 210b and/or the second impedance element 220b may include at least one resistor, at least one capacitor, at least one inductor, or a combination thereof. When the first impedance element 210b and/or the second impedance element 220b includes a plurality of circuit elements, the respective circuit elements may be connected with one another in series and/or in parallel.

In a specific embodiment, the first impedance element 210b may include at least one RC circuit $RC_{n,c1}$ composed of a resistor and a capacitor connected in parallel, and a resistor $R_{0,c1}$ connected in series with the same. As used herein, n is an index representing n-th RC circuit. n is a natural number between 1 and p, and minimum value of p is 1.

Similarly, the second impedance element 220b may include at least one RC circuit $RC_{m,c2}$ composed of a resistor and a capacitor connected in parallel, and a resistor $R_{0,c2}$ connected in series with the same. As used herein, m is an index representing m-th RC circuit. m is a natural number between 1 and q, and minimum value of q is 1.

The RC circuits $RC_{n,c1}$, $RC_{m,c2}$ correspond to the circuit elements provided to simulate the polarization voltage which is generated during operation of the first secondary battery and the second secondary battery. The electrical characteristic values and number of elements of the resistors and the capacitors included in the RC circuits $RC_{n,c1}$, $RC_{m,c2}$, as well as the number of the RC circuits $RC_{n,c1}$, $RC_{m,c2}$ may vary according to the polarization voltage characteristics of the first secondary battery and the second secondary battery. Further, when the polarization voltages of the first secondary battery and the second secondary battery are negligibly low, the RC circuits $RC_{n,c1}$, $RC_{m,c2}$ may be omitted.

The series resistors $R_{0,c1}$, $R_{0,c2}$ correspond to the circuit elements provided to simulate the IR voltage which is generated during operation of the first secondary battery and the second secondary battery. The electrical characteristic values of the series resistors $R_{0,c1}$, $R_{0,c2}$ may vary according to IR voltage characteristics. Further, the number of the series resistors $R_{0,c1}$, $R_{0,c2}$ may be two or more depending on embodiments. When the IR voltages of the first secondary battery and the second secondary battery are negligibly small, the series resistors $R_{0,c1}$, $R_{0,c2}$ may be omitted.

Preferably, the control unit 130 may determine a first impedance voltage $V_{i,c1}$ formed by the first impedance element, by using a first impedance voltage formula derived from connection relation and electrical characteristic values of the circuit elements included in the first impedance element 210b. Similarly, the control unit 130 may determine a second impedance voltage $V_{i,c2}$ formed by the second impedance element 220b, by using a second impedance voltage formula derived from connection relation and electrical characteristic values of the circuit elements included in the second impedance element 220b. As used herein, the electrical characteristic value of each of the circuit elements may be determined based on a type of the corresponding circuit element, and this may be any one of a resistance value, a capacitance value and an inductance value.

The first impedance voltage $V_{i,c1}$ can be determined based on a sum of voltages that are formed by the series-connected circuit elements included in the first impedance element 210b, and the second impedance voltage $V_{i,c2}$ can be determined based on a sum of voltages that are formed by the series-connected circuit elements included in the second impedance element 220b.

Preferably, when the first impedance element 210b and the second impedance element 220b include series resistors, the voltages formed by the series resistors may not be taken into account in determining the first impedance voltage $V_{i,c1}$ and the second impedance voltage $V_{i,c2}$.

When the first impedance element 210b and/or the second impedance element 220b include at least one or more RC circuits, the voltages formed by the respective RC circuits may be determined based on the time-discrete equation as Equation (1) below. Since the time-discrete equation below is already well known, details of deriving the same will not be described herein.

$$V_{RC}[k+1] = \exp\left(-\frac{\Delta t}{RC}\right)V_{RC}[k] + R\left(1 - \exp\left(-\frac{\Delta t}{RC}\right)\right)I_{RC}[k] \qquad (1)$$

In Equation (1), k denotes time index, $\Delta t$ denotes time interval between time index k and time index k+1, R and C respectively denote a resistance value and a capacitance value of the circuit elements included in the RC circuit, $I_{RC}[k]$ denotes current flowing through the RC circuit, and $V_{RC}[k]$ denotes voltage formed at the RC circuit by the current $I_{RC}[k]$.

Meanwhile, the operating current I equals to a sum of the first current $I_{c1}$ flowing through the first circuit unit 210 and a second current $I_{c2}$ flowing through the second circuit unit 220. Accordingly, at arbitrary time, the relationships between the operating current I, the first current $I_{c1}$ and the second current $I_{c2}$ can be expressed by Equation (2) below.

$$I[k] = I_{c1}[k] + I_{c2}[k] \qquad (2)$$

In Equation (2), during the hybrid secondary battery 110 charging, $I[k]$, $I_{c1}[k]$ and $I_{c2}[k]$ have positive values. In contrast, during the hybrid secondary battery 110 discharging, $I[k]$, $I_{c1}[k]$ and $I_{c2}[k]$ have negative values.

The control unit 130 may determine the first current $I_{c1}[k]$ and the second current $I_{c2}[k]$, respectively, by using a first current distribution equation and a second current distribution equation derived from the circuit model 200.

The process of deriving the first current distribution equation and the second current distribution equation in a time-discrete equation will be described below.

First, at time index k, the first current and the second current may be expressed by Equations (3) and (4) below.

$$I_{c1}[k] = \frac{V[k] - \left(OCV_{c1}(z_{c1}[k]) + \sum_{n} V_{RC,c1}^{n}[k]\right)}{R_{0,c1}} \qquad (3)$$

$$I_{c2}[k] = \frac{V[k] - \left(OCV_{c2}(z_{c2}[k]) + \sum_{m} V_{RC,c2}^{m}[k]\right)}{R_{0,c2}} \qquad (4)$$

In the above equations, V[k] denotes the voltage of the hybrid secondary battery.

$$\sum_{n} V_{RC,c1}^{n}[k]$$

denotes a sum of voltages formed by at least one or more RC circuits $RC_{n,c1}$ included in the first circuit unit 210, in which $V_{RC,c1}^{n}$ denotes voltage formed at the n-th RC circuit. Similarly, $$\sum_m V_{RC,c2}^m[k]$$

denotes a sum of voltages formed by at least one or more RC circuits $RC_{m,c2}$ included in the second circuit unit 220, in which $V^m{}_{RC,c2}$ denotes the voltage formed at the m-th RC circuit. $z_{c1}[k]$ and $z_{c2}[k]$ denote states of charge of the first secondary battery and the second secondary battery, respectively. $R_{0,c1}$ and $R_{0,c2}$ denote resistance values of the series resistors included in the first circuit unit 210 and the second circuit unit 220, respectively.

By substituting Equations (3) and (4) into Equation (2) and rearranging with respect to the voltage V[k] of the hybrid secondary battery, the voltage equation as Equation (5) below may be obtained.

$$V[k] = \frac{\left(OCV_{c1}(z_{c1}[k]) + \sum_n V_{RC,c1}^n[k]\right)R_{0,c2} - \left(OCV_{c2}(z_{c2}[k]) + \sum_m V_{RC,c2}^m[k]\right)R_{0,c1} + I[k]R_{0,c1}R_{0,c2}}{R_{0,c1} + R_{0,c2}} \quad (5)$$

Next, by substituting Equation (5) into Equations (3) and (4), the first current distribution equation (6) and the second current distribution equation (7) may be obtained as below.

$$I_{c1}[k] = \frac{\left(OCV_{c2}(z_{c2}[k]) + \sum_m V_{RC,c2}^m[k]\right) - \left(OCV_{c1}(z_{c1}[k]) + \sum_n V_{RC,c1}^n[k]\right) + I[k]R_{0,c2}}{R_{0,c1}} \quad (6)$$

$$I_{c2}[k] = \frac{\left(OCV_{c1}(z_{c1}[k]) + \sum_n V_{RC,c1}^n[k]\right) - \left(OCV_{c2}(z_{c2}[k]) + \sum_m V_{RC,c2}^m[k]\right) + I[k]R_{0,c1}}{R_{0,c1}} \quad (7)$$

Equations (6) and (7) may be used for making quantitative determination of the magnitudes of the first and second currents which are divided and flows to the first secondary battery and the second secondary battery, respectively, when the operating current I of the hybrid secondary battery flows.

In Equations (6) and (7), $OCV_{c1}(z_{c1}[k])$ and $OCV_{c2}(z_{c2}[k])$ may be determined by using open-circuit voltage profiles pre-defined by experiment for the first secondary battery and the second secondary battery, $$\sum_n V_{RC,c1}^n[k] \text{ and } \sum_m V_{RC,c2}^m[k]$$

may be determined by utilizing Equation (1) and the first current $I_{c1}[k]$ and the second current $I_{c2}[k]$.

Further, the state of charge $z_{c1}[k]$ of the first secondary battery and the state of charge $z_{c2}[k]$ of the second secondary battery may be time-updated by ampere counting method, by Equations (8) and (9).

$$z_{c1}[k+1] = z_{c1}[k] + \frac{I_{c1}[k]}{Q_{c1}}\Delta t \quad (8)$$

$$z_{c2}[k+1] = z_{c2}[k] + \frac{I_{c2}[k]}{Q_{c2}}\Delta t \quad (9)$$

In the above Equations, $I_{c1}[k]$ and $I_{c2}[k]$ are currents flowing through the first circuit unit 210 and the second circuit unit 220, respectively, and may be determined by Equations (6) and (7). Further, $Q_{c1}$ and $Q_{c2}$ represent capacities of the first secondary battery and the second secondary battery, respectively. $\Delta t$ is time interval between time indexes k and k+1, and corresponds to the time update period of the first state of charge $z_{c1}[k]$ and the second state of charge $z_{c2}[k]$. When the hybrid secondary battery is being charged, $I_{c1}$ and $I_{c2}$ have positive values. In contrast, when the secondary battery is being discharged, $I_{c1}[k]$ and $I_{c2}[k]$ have negative values.

According to the present disclosure, a plurality of equations derived from the circuit model 200 are used for the derivation of the state equation and the output equation of the Extended Kalman Filter.

The Extended Kalman Filter is a software algorithm that can statistically estimate the state of a dynamic system, by taking into account externally-measurable parameters regarding the system and disturbances of the system.

According to the present disclosure, the 'state' of the system refers to electrochemical parameter with time-based variation characteristic, and by assuming the hybrid secondary battery 110 to be one system, it may include at least one parameter selected from the group consisting of: first state of charge $z_{c1}[k]$; second state of charge $z_{c2}[k]$; voltage formed by at least one circuit element included in the first impedance element 210b; and the voltage formed by at least one circuit element included in the second impedance element 220b.

The basic principle of the Extended Kalman Filter described above is already well known in the art, as can be found in the thesis by Gregory L. Plett, titled "Extended Kalman Filtering for battery management systems of LiPB-based HEV battery packs Part 1. Background" (Journal of Power Source 134, 2004, 252-261), the disclosure of which is incorporated herein by reference in its entirety.

$$x_{k+1} = f(x_k, u_k, w_k) \qquad \text{state equation:}$$

$$y_{k+1} = g(x_k, u_k, v_k) \qquad \text{out equation:}$$

where, $x_k$ denotes state of system intended to be estimated using Extended Kalman Filter, $u_k$ is an input to the Extended Kalman Filter as a measurable parameter for a system, $w_k$ is a process noise modeling non-measured input which influences the state of the system, $y_k$ is an externally-measurable output from the system, and $v_k$ is a sensor noise modeling inaccuracy of a sensor influencing system output measurement.

As well known in the art, the Extended Kalman Filter can estimate the state $\hat{x}_k^+$ of the system by using the state equation and the output equation, by iterating steps ① to ⑥ described below, while incrementing k by 1 from 1 whenever update time $\Delta t$ elapses. Hereinbelow, steps ① to ⑥ will be called the 'Extended Kalman Filter algorithm'.

State estimate time update: $\hat{x}_k^- = f(x_{k-1}^+, u_{k-1}, \bar{w}_{k-1})$ ①

Error covariance time update: $\Sigma_{\tilde{x},k}^- = \hat{A}_{k-1} \Sigma_{\tilde{x},k-1}^+ \hat{A}_{k-1}^T + \hat{B}_{k-1} \Sigma_{\tilde{w}} \hat{B}_{k-1}^T$ ②

Output update: $\hat{y}_k = g(\hat{x}_k^-, u_k, \bar{v}_k)$ ③

Kalman gain determination: $L_k = \Sigma_{\tilde{x},k}^- \tilde{C}_k^T [\tilde{C}_k \Sigma_{\tilde{x},k}^- \hat{C}_k^T + \hat{D}_k \Sigma_{\tilde{v}} \hat{D}_k^T]^{-1}$ ④

State estimate measurement update: $\hat{x}_k^+ = \hat{x}_k^- + L_k [y_k - \hat{y}_k]$ ⑤

Error covariance measurement update: $\Sigma_{\tilde{x},k}^+ = (I - L_k \hat{C}_k) \Sigma_{\tilde{x},k}^-$ ② where, $\bar{w}_k$ and $\bar{v}_k$ are zero-means for covariances $\Sigma_{\bar{w}}$ and $\Sigma_{\bar{v}}$ of the process noise and the sensor noise, respectively.

Further, $\hat{A}_k$, $\hat{B}_k$, $\hat{C}_k$, and $\hat{D}_k$ may be determined using partial derivative equations provided below by linearizing the state equation (f) and the output equation (g) with the first-order Taylor-series expansion in each time index k, and may be expressed as the Jacobian matrices when state x and input u are matrices including a plurality of parameters.

$$\hat{A}_k = \left.\frac{\partial f}{\partial x}\right|_{x=\hat{x}_k^+}, \hat{B}_k = \left.\frac{\partial f}{\partial u}\right|_{u=u_k}, \hat{C}_k = \left.\frac{\partial g}{\partial x}\right|_{x=\hat{x}_k^-}, \hat{D}_k = \left.\frac{\partial g}{\partial u}\right|_{u=u_k}$$

According to the present disclosure, the state equation and the output equation of the Extended Kalman Filter may be defined as time-discrete equation forms described below, by using a plurality of equations above derived from the circuit model 200. However, the present disclosure is not limited to the state equation and the output equation described below.

State equation $$z_{c1}[k+1] = z_{c1}[k] + \frac{(I_{c1}[k] + w_{c1}[k])}{Q_{c1}} \Delta t$$

$$z_{c2}[k+1] = z_{c2}[k] + \frac{(I_{c2}[k] + w_{c2}[k])}{Q_{c2}} \Delta t$$

-continued $$V_{RC,c1}^n[k+1] = \exp\left(-\frac{\Delta t}{R_{n,c1} C_{n,c1}}\right) V_{RC,c1}^n[k] + R_{n,c1}\left(1 - \exp\left(-\frac{\Delta t}{R_{n,c1} C_{n,c1}}\right)\right)(I_{c1}[k] + w_{c1}[k])$$

$(n = 1, 2, \ldots, p)$ $$V_{RC,c2}^m[k+1] = \exp\left(-\frac{\Delta t}{R_{m,c2} C_{m,c2}}\right) V_{RC,c2}^m[k] + R_{m,c2}\left(1 - \exp\left(-\frac{\Delta t}{R_{m,c2} C_{m,c2}}\right)\right)(I_{c2}[k] + w_{c2}[k])$$

$(m = 1, 2, \ldots, q)$

Corresponding the above equations to the state equation $x_{k+1} = f(x_k, u_k, w_k)$, state $x_k$ may be defined to be the column vector including $z_{c1}[k]$, $z_{c2}[k]$, $V_{RC,c1}^n[k]$ (n=1, 2, ..., p) and $V_{RC,c2}^m[k]$ (m=1, 2, ..., q) as the state parameters, input $u_k$ may be defined to be the column vector including $I_{c1}[k]$ and $I_{c2}[k]$ as the input parameters, and the process noise $w_k$ may be defined to be the column vector including $w_{c1}[k]$ and $w_{c2}[k]$ as the noise parameters. $I_{c1}[k]$ and $I_{c2}[k]$ may be time-updated by Equations (6) and (7), respectively.

$w_{c1}[k]$ and $w_{c2}[k]$ correspond to the process noise, and are parameters related with errors which are caused due to absence of consideration of other factors that may influence the state of the system. The process noise is the value that is tuned in consideration of accuracy and sensitivity of the Extended Kalman Filter, and it may be a fixed value, or a variable value that varies according to the state of charge, degradation rate, temperature, etc. of the hybrid secondary battery.

Meanwhile, at least one or more of the state parameters may be omitted. For example, if the impedance element included in the first circuit unit or the second circuit unit can be ignored, then the parameters related with the corresponding impedance element may be omitted from the state parameters. Further, when a certain parameter is dependent on other parameters, the certain parameter may also be excluded from the state parameters. Further, when a certain parameter can be incorporated as a part of another parameter, then the certain parameter may also be excluded from the state parameters. As described, if the number of state parameters decreases, the dimension of the state equation correspondingly decreases, so that computation of the Extended Kalman Filter algorithm is simplified, and accordingly, filter tuning is facilitated. It is apparent that, contrary to the embodiment described above, the state parameters may additionally include more parameters.

Output equation $$V[k] = \frac{\left(OCV_{c1}(z_{c1}[k]) + \sum_n V_{RC,c1}^n[k]\right)R_{0,c2} + \left(OCV_{c2}(z_{c2}[k]) + \sum_m V_{RC,c2}^m[k]\right)R_{0,c1} + I[k]R_{0,c1}R_{0,c2}}{R_{0,c1} + R_{0,c2}} + v[k]$$

By corresponding the output equation to $y_{k+1} = g(x_k, u_k, v_k)$, the output is the operating voltage V[k] of the hybrid secondary battery. Further, I[k] is a value that is measurable as the operating current of the hybrid secondary battery. Referring to Equation (2), I[k] can be expressed by $I_{c1}[k]$ and $I_{c2}[k]$. Accordingly, I[k] substantially corresponds to the input $u_k$ of the Extended Kalman Filter. v[k] corresponds to the sensor noise accompanied in the process of measuring current and/or voltage of the hybrid secondary battery. v[k] may be tuned to a fixed value, or tuned to a value that may vary according to the state of charge, degradation rate, temperature, etc. of the hybrid secondary battery, in consideration of the accuracy and sensitivity of the Extended Kalman Filter. When determining V[k] by using the output equation, the electrical characteristic values of the circuit elements included in the impedance element may be directly measured by experiment, or tuned by the rule of trial and error in consideration of the accuracy and sensitivity of the Extended Kalman Filter. Further, the open-circuit voltages $OCV_{c1}(z_{c1}[k])$ and $OCV_{c2}(z_{c2}[k])$ may be determined by using a corresponding open-circuit voltage profile pre-defined by experiment. Further, voltages $V^n_{RC,c1}[k](n=1, 2, \ldots, p)$ and $V^m_{RC,c2}[k](m=1, 2, \ldots, q)$ formed by the RC circuit may be determined by using Equations (1), (3) and (4) described above, and the electrical characteristic values of the circuit elements constructing the corresponding impedance element included in the first and the second circuit units 210, 220.

Meanwhile, it is necessary to set initial conditions of the respective state parameters included in the state, in order to implement the Extended Kalman Filter algorithm. The initial conditions of the state parameter are preferably set so that the Extended Kalman Filter follows the actual state of the system efficiently.

Since the Extended Kalman Filter has robustness against the initial condition, the initial conditions do not have to be limited to any specific conditions. Accordingly, the initial conditions of the state parameters may be set arbitrarily to satisfy the condition that the state of the system estimated by the Extended Kalman Filter is not diverged.

Preferably, the initial conditions of the state parameters may be set as Equation (10) below.

$$z_{c1}[0]=OCV_{c1}^{-1}(V[0])$$

$$z_{c2}[0]=OCV_{c2}^{-1}(V[0]) \quad (10)$$

$V^n_{RC,c1}[0]=0$ (n is sequence index of RC circuit)

$V^m_{RC,c2}[0]=0$ (m is sequence index of RC circuit)

Referring to the initial conditions of the state parameters, V[0] is the operating voltage initially measured at the beginning of charging or discharging of the hybrid secondary battery, and approximately, this corresponds to the open-circuit voltage at the time of beginning charging or discharging the hybrid secondary battery. The operator $OCV_{c1}^{-1}$ is an inverse transform operator of the operator $OCV_{c1}(z_{c1}[k])$ that transforms the first state of charge $z_{c1}$ of the first secondary battery into the first open-circuit voltage, and may be determined from the open-circuit voltage profile of the first secondary battery pre-defined by experiment. Similarly, the operator $OCV_{c2}^{-1}$ is an inverse transform operator of the operator $OCV_{c2}(z_{c2}[k])$ that transforms the second state of charge $z_{c2}$ of the second secondary battery into the second open-circuit voltage, and may be determined from the open-circuit voltage profile of the second secondary battery pre-defined by experiment. Preferably, the open-circuit voltage profiles may be pre-defined as look-up table or look-up function forms, although embodiments are not limited thereto.

Figure 5:
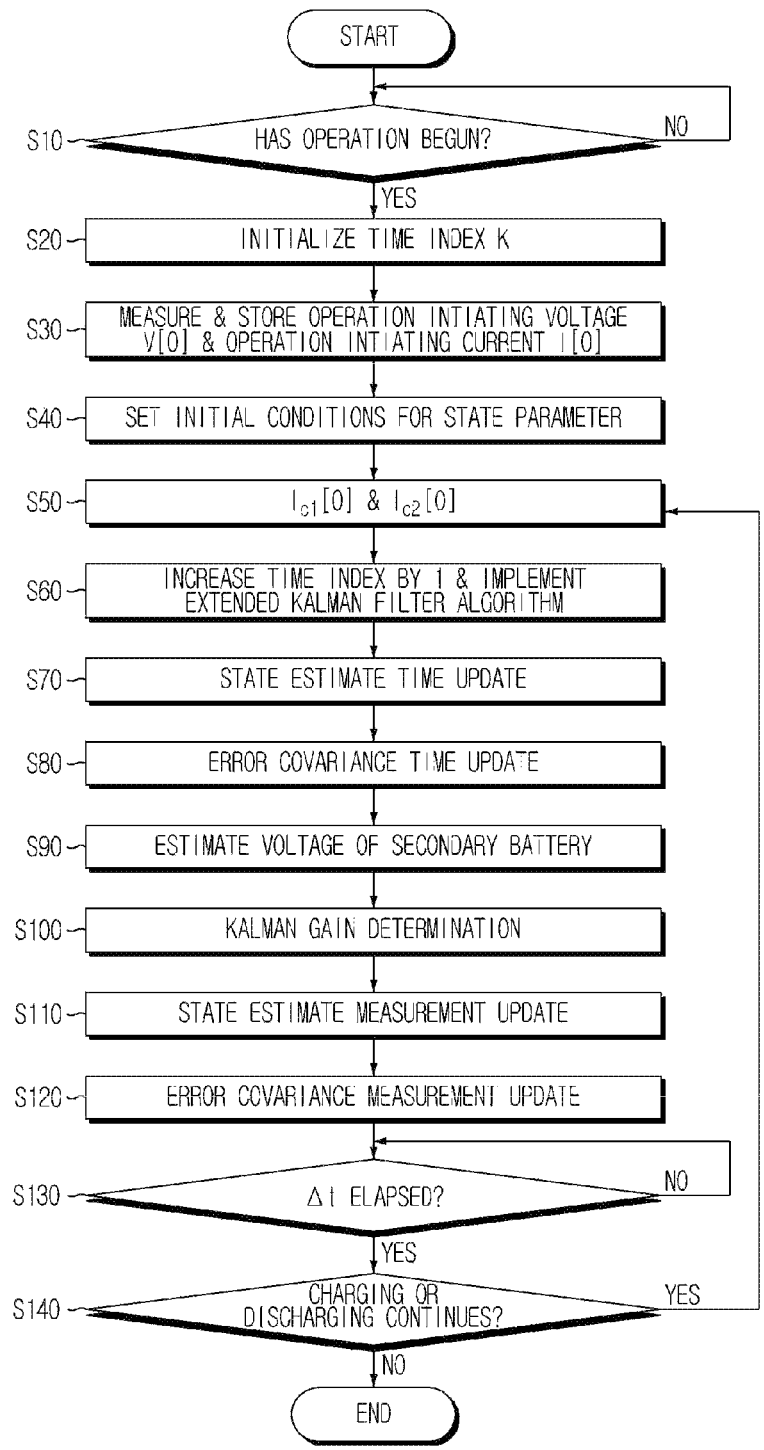
FIG. 5 is a flowchart sequentially illustrating a method for estimating a state of a hybrid secondary battery by using Extended Kalman Filter, according to an embodiment of the present disclosure.

Hereinbelow, referring to FIG. 5, a method of the control unit 130 estimating a state of a hybrid secondary battery immediately after the hybrid secondary battery starts charging or discharging whenever an update period Δt elapses, by iterating the Extended Kalman Filter algorithm using the state equation and the output equation, will be described in detail.

First, at S10, the control unit 130 determines whether or not the operation (i.e., charging or discharging) of the hybrid secondary battery has begun, by monitoring with the sensor unit 120, the direction and magnitude of the current flowing through the hybrid secondary battery 110.

When determining that the operation of the hybrid secondary battery 110 has begun, at S20, the control unit 130 initializes time index k to 0.

Next, at S30, the control unit 130 measures, through the sensor unit 120, V[0] corresponding to the operation initiating voltage of the hybrid secondary battery 110 and I[0] corresponding to operation initiating current, and stores the same in the storage unit 160.

After measuring and storing of V[0] and I[0], at S40, the control unit 130 sets the initial conditions of the state parameters of the system as follows.

$$\hat{z}_{c1}^+[0]=OVC_{c1}^{-1}(V[0])$$

$$\hat{z}_{c2}^+[0]=OCV_{c2}^{-1}(V[0])$$

$\hat{V}_{RC,c1}^{+n}[0]=0$ (n is sequence index of RC circuit, n=1, 2, \ldots, p)

$\hat{V}_{RC,c2}^{+m}[0]=0$ (m is sequence index of RC circuit, m=1, 2, \ldots, q)

Next, at S50, the control unit 130 determines $I_{c1}[0]$ and $I_{c2}[0]$ using Equations (6) and (7) and operation initiating current I[0].

During the initial condition setting, the control unit 130 may refer to the electrical characteristic values of the respective circuit elements included in the first circuit unit 210 and the second circuit unit 220. To this purpose, the electrical characteristic values may preferably be stored at the storage unit 160 in advance. The electrical characteristic values of the respective circuit elements may be stored as fixed values or variable values. When the electrical characteristic values are stored as variable values, the electrical characteristic values may be varied according to the state of charge, temperature, capacity degradation rate, and so on, of the hybrid secondary battery.

After determining $I_{c1}[0]$ and $I_{c2}[0]$, at S60, the control unit 130 increases time index k by 1, and then performs the six steps of the Extended Kalman Filter algorithm in order.

First, at S70, the control unit 130 performs the state estimate time update as described below, using the initial conditions of the state parameters and $I_{c1}[0]$ and $I_{c2}[0]$.

$$\hat{z}_{c1}^-[1] = \hat{z}_{c1}^+[0] + \frac{(I_{c1}[0]+w_{c1}[0])}{Q_{c1}}\Delta t$$

$$\hat{z}_{c2}^-[1] = \hat{z}_{c2}^+[0] + \frac{(I_{c2}[0]+w_{c2}[0])}{Q_{c2}}\Delta t$$

$$\hat{V}_{RC,c1}^{-n}[1] = \exp\left(-\frac{\Delta t}{R_{n,c1}C_{n,c1}}\right)\hat{V}_{RC,c1}^{+n}[0] +$$
$$R_{n,c1}\left(1 - \exp\left(-\frac{\Delta t}{R_{n,c1}C_{n,c1}}\right)\right)(I_{c1}[0]+w_{c1}[0])$$

$(n = 1, 2, \ldots, p)$ $$\hat{V}_{RC,c2}^{-m}[1] = \exp\left(-\frac{\Delta t}{R_{m,c2}C_{m,c2}}\right)\hat{V}_{RC,c2}^{+m}[0] +$$
$$R_{m,c2}\left(1 - \exp\left(-\frac{\Delta t}{R_{m,c2}C_{m,c2}}\right)\right)(I_{c2}[0]+w_{c2}[0])$$

$(m = 1, 2, \ldots, q)$

Of course, when the state parameter is adjusted, it is apparent that the equations used in the state estimate time update can also be correspondingly modified.

Second, at S80, the control unit 130 performs the error covariance time update of the state using the following equation.

$$\Sigma_{\tilde{x},1}^- = \hat{A}_0 \Sigma_{\tilde{x},0}^+ \hat{A}_0^T + \hat{B}_0 \Sigma_{\tilde{w}} \hat{B}_0^T$$

In the above equations, the Jacobian matrices $\hat{A}_0$ and $\hat{B}_0$ may be determined by the partial derivative equations below, based on the time-updated state parameter $\hat{x}_0^+$ and initial condition $u_0$ of the input parameter, pre-defined electrical characteristic values, and open-circuit voltage profiles.

$$\hat{A}_0 = \frac{\partial f}{\partial x}\bigg|_{x=\hat{x}_0^+}, \quad \hat{B}_0 = \frac{\partial f}{\partial u}\bigg|_{u=u_0}$$

When the state equation is modified, it is apparent that the Jacobian matrices will also be correspondingly modified. The initial condition $\Sigma_{\tilde{x},0}^+$ for the error covariance of the state and the error covariance $\Sigma_{\tilde{w}}$ of the process noise may be tuned by the rule of trial and error.

In one embodiment, $\Sigma_{\tilde{w}}$ may be represented by the following equation, and diagonal components may be tuned into proper values by the rule of trial and error.

$$\Sigma_{\tilde{w}} = \begin{bmatrix} \sigma_{I_{c1}}^2 & 0 \\ 0 & \sigma_{I_{c2}}^2 \end{bmatrix}$$

Third, at S90, the control unit 130 measures through the sensor unit 120 the current I[1] of the secondary battery, and updates the input parameter to $u_1$ by updating the first current and the second currents into $I_{c1}[1]$ and $I_{c2}[1]$ respectively by using the current I[1], and estimates the operating voltage V of the hybrid secondary battery corresponding to an output of the system, by using the output equation, the time-updated state parameter, and the measured current I[1] of the secondary battery as below.

Fourth, at S100, the control unit 130 calculates Kalman gain using the following equation.

$$L_1 = \Sigma_{\tilde{x},1}^- \hat{C}_1^T [\hat{C}_1 \Sigma_{\tilde{x},1}^- \hat{C}_1^T + \hat{D}_1 \Sigma_{\tilde{v}} \hat{D}_1^T]^{-1}$$

In the above equation, the Jacobian matrices $\hat{C}_1$ and $\hat{D}_1$ may be determined by the partial derivation equations described below, based on the state $\hat{x}_1^-$ time-updated in the first step and the updated input $u_1$, pre-defined electrical characteristic values, and open-circuit voltage profiles pre-defined by experiment.

$$\hat{C}_1 = \frac{\partial g}{\partial x}\bigg|_{x=\hat{x}_1^-}, \quad \hat{D}_1 = \frac{\partial g}{\partial u}\bigg|_{u=u_1}$$

When the output equation is modified, it is apparent that the Jacobian matrices will also be correspondingly modified. Further, $\Sigma_{\tilde{x},1}^-$ is the time-updated error covariance determined in the second step. The error covariance of the sensor noise $\Sigma_{\tilde{v}}$ may be tuned by the rule of trial and error.

In one embodiment, $\Sigma_{\tilde{v}}$ may be represented by the following equation, and $\sigma_{\tilde{v}}^2$ is tunable to a proper value by the rule of trial and error.

$$\Sigma_{\tilde{v}} = (\sigma_{\tilde{v}}^2)$$

Fifth, at S110, the control unit 130 performs the state estimate measurement update, using the following equation. To this purpose, the control unit 130 may perform state estimate measurement update, by measuring the voltage V[1] of the hybrid secondary battery through the sensor unit 120, then multiplying a difference between the measured voltage and the voltage $\hat{V}^+[1]$ estimated as the output of the system in the third step, by the Kalman gain $L_1$ determined in the fourth step, and adding the result of the multiplication to the time-updated state estimate determined in the first step.

$$\hat{V}^+[1] = \frac{\left(OCV_{c1}(\hat{z}_{c1}^-[1]) + \sum_n \hat{V}_{RC,c1}^{-n}[1]\right) R_{0,c2} + \left(OCV_{c2}(\hat{z}_{c2}^-[1]) + \sum_m \hat{V}_{RC,c2}^{-m}[1]\right) R_{0,c1} + I[1] R_{0,c1} R_{0,c2}}{R_{0,c1} + R_{0,c2}} + v[1]$$

In the above equation, $OCV_{c1}(\hat{z}_{c1}^-[1])$ and $OCV_{c2}(\hat{z}_{c2}^-[1])$ may be determined by using the open-circuit voltage profiles pre-defined for the first secondary battery and the second secondary battery by experiment. Further, $$\sum_n \hat{V}_{RC,c1}^{-n}[1] \text{ and } \sum_m \hat{V}_{RC,c1}^{-m}[1]$$

may be determined by using the RC circuit voltages time-updated in the first step. I[1] is the operating current measured by the sensor unit 120. The series resistance values $R_{0,c1}$, $R_{0,c2}$ of the first and the second circuit units are pre-defined by experiment and these may be fixed values, or variable values that vary according to the state of charge, degradation rate, temperature, etc. of the hybrid secondary battery.

In the above equation, v[1] is the sensor noise tuned by the rule of trial and error, and it may be set as a fixed value or a variable value.

$$\begin{bmatrix} \hat{z}_{c1}^+[1] \\ \hat{z}_{c2}^+[1] \\ \hat{V}_{RC,c1}^{+n}[1] \\ \hat{V}_{RC,c2}^{+m}[1] \end{bmatrix} = \begin{bmatrix} \hat{z}_{c1}^-[1] \\ \hat{z}_{c2}^-[1] \\ \hat{V}_{RC,c1}^{-n}[1] \\ \hat{V}_{RC,c2}^{-m}[1] \end{bmatrix} + L_1 \left( V[1] - \hat{V}^+[1] \right)$$

In the above equation, the matrices on the left side and the right side are column vector matrices having a dimension of $(2+p+q)\ast 1$, where p denotes the number of RC circuits included in the first circuit unit, and q denotes the number of RC circuits included in the second circuit unit.

The equation used for the state estimate measurement update may be modified according to changing in the state parameter. For example, when the state parameter related with the first impedance element included in the first circuit unit is excluded, a related term(s) may be excluded from the matrix included in the equation. As a result, the dimension of the matrix may be adjusted. However, the present disclosure is not limited herein.

Lastly, at S120, the control unit 130 performs error covariance measurement update using the following equation. The terms on the right side of the following equation are all determined at the steps described above, and I corresponds to the unit matrix.

$$\Sigma_{\tilde{x},1}^{+}=(I-L_1\hat{C}_1)\Sigma_{\tilde{x},1}^{-}$$

When a series of steps described above are performed, the first estimation of the state of the hybrid secondary battery is completed.

When the state estimate of the system is completed, at S130, the control unit 130 counts time and determines whether the update period $\Delta t$ of the system state has elapsed or not.

When determining that the update period has elapsed, at S140, the control unit 130 monitors through the sensor unit 120 the direction and magnitude of the current flowing through the hybrid secondary battery and determines whether charging or discharging of the hybrid secondary battery continues or not.

When determining that the charging or discharging of the hybrid secondary battery continues, the control unit 130 proceeds the process to S60, and accordingly, increases the time index k by 1 and resumes iterating the Extended Kalman Filter algorithm.

The recursive algorithm described above repeats whenever a predetermined time $\Delta t$ elapses while the hybrid secondary battery maintains charging or discharging. Further, the estimated state of the system by the Extended Kalman Filter provides estimation closer to the actual state of the hybrid secondary battery as the recursive algorithm repeats.

Meanwhile, when determining that charging or discharging of the hybrid secondary battery is substantially finished, at S140, the control unit 130 finishes the secondary battery state estimation using the Extended Kalman Filter. The expression 'substantially finished' as used herein refers to a state at which the voltage of the hybrid secondary battery is stabilized, as a sufficient time has elapsed after ending of charging or discharging.

The control unit 130 may store the results determined at each step into the storage unit 160, transmit to another external control unit, or display as a graphic interface through the display unit 150. The 'graphic interface' as used herein encompasses text, picture, graphic or a combination thereof.

Further, the control unit 130 may use the operating voltage of the hybrid secondary battery estimated in the third step of the Extended Kalman Filter algorithm, in order to control charging or discharging of the hybrid secondary battery.

Further, the control unit 130 may refer to the estimated operating voltage when determining the state of charge or capacity degradation of the hybrid secondary battery. In this case, the control unit 130 may be included as a part of a battery management system which controls overall operation of the hybrid secondary battery.

Alternatively, the control unit 130 may transmit the operating voltage estimated in the third step of the Extended Kalman Filter algorithm to a control unit in charge of controlling charging or discharging of the hybrid secondary battery. For example, for a hybrid secondary battery mounted to an electric vehicle or a hybrid electric vehicle, the control unit 130 may transmit the estimated operating voltage to the central control unit of the vehicle.

Further, the control unit 130 may estimate the state of charge $\hat{z}_{cell}[k]$ (k=1, 2, 3, . . . ), of the hybrid secondary battery with the equation below whenever estimating the state of the system using the Extended Kalman Filter.

$$\hat{z}_{cell}[k]=\alpha\hat{z}_{c1}^{+}[k]+\beta\hat{z}_{c2}^{+}[k]$$

Referring to the equation above, $\alpha$ and $\beta$ denote ratios of the capacities of the first secondary battery and the second secondary battery with respect to the total capacity of the hybrid secondary battery, respectively. For example, when the capacities of the first secondary battery and the second secondary battery are 20% and 80% of the total capacity, $\alpha$ and $\beta$ are 0.2 and 0.8, respectively.

Further, the control unit 130 may store the state of charge $\hat{z}_{cell}[k]$ of the hybrid secondary battery to the storage unit 160, output as a graphic interface through the display unit 150, or transmit to an external control unit through a communication interface or a data transmission interface.

In order to implement a variety of control logics including those described above, the control unit 130 may optionally include a known processor, application-specific integrated circuit (ASIC), other chipsets, logic circuit, register, communication modem, data processor, and so on. Further, when the control logic is implemented as software, the control unit 130 may be implemented as a set of program modules. In this case, the program modules may be stored at a memory and executed by the processor. The memory may be internal or external to the processor and may be connected with the processor with a variety of known computer components. Further, the memory may be included in the storage unit 160 of the present disclosure. Further, the 'memory' collectively refers to any type of devices where information is stored, and is not intended to refer to any specific memory device.

Further, it is apparent that the control logics of the control unit 130 may construct a process of a method for estimating voltage of a hybrid secondary battery according to embodiments of the present disclosure.

Further, at least one or more of control logics of the control unit 130 may be combined and the combined control logics may be written by a computer-readable code system and recorded on a computer-readable recording medium. The recording medium is not limited to any specific type, as long as it is accessible by a processor included in the computer. In one example, the recording medium may include at least one or more selected from the group consisting of ROM, RAM, register, CD-ROM, magnetic tape, hard disk, floppy disk, and optical data recording device. Further, the code system may be modulated into carrier signals and included in the communication carriers at a specific time point, and distributed over a networked computer and stored and executed therein. Further, programmers in the technical field pertinent to the present disclosure will be easily able to envision functional programs, codes and code segments to implement the combined control logics.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

DESCRIPTION OF REFERENCE NUMERALS

100: apparatus for estimating state of hybrid secondary battery
110: hybrid secondary battery   120: sensor unit
130: control unit               140: load
150: display unit               160: storage unit

What is claimed is:

1. An apparatus for estimating a state of a hybrid secondary battery, wherein the hybrid secondary battery comprises a first secondary battery and a second secondary battery having different electrochemical characteristics from each other and being connected in parallel with each other, the apparatus comprising:
a sensor unit configured to measure, at time intervals, an operating voltage and an operating current of the hybrid secondary battery; and
a battery management system (BMS) electrically connected with the sensor unit, and configured to estimate the state of the hybrid secondary battery, wherein the state comprises at least one of a first state of charge of the first secondary battery and a second state of charge of the second secondary battery, by implementing an Extended Kalman Filter algorithm using a state equation and an output equation, wherein the state equation comprises, as a state parameter, the first state of charge of the first secondary battery and the second state of charge of the second secondary battery, and the output equation comprises, as an output parameter, the operating voltage of the hybrid secondary battery,
wherein the state equation and the output equation are derived from a first circuit unit and a second circuit unit which correspond to the first secondary battery and the second secondary battery, respectively, and connected in parallel with each other, and
at least one of the first circuit unit and the second circuit unit comprises an open-circuit voltage element varying voltage according to a state of charge of a corresponding secondary battery connected in series with an impedance element varying voltage according to current flowing through a corresponding circuit unit,
wherein the open-circuit voltage element includes a first open-circuit voltage element and a second open-circuit voltage element,
wherein the first open-circuit voltage element varies voltage according to the state of charge of the first secondary battery,
wherein the second open-circuit voltage element varies voltage according to the state of charge of the second secondary battery,
wherein the BMS is configured to initiate charging and discharging of the hybrid secondary battery based on the estimated state of the hybrid secondary battery,
wherein the different electrochemical characteristics include:
a difference in a positive electrode material, a difference in a negative electrode material, or a difference in an electrolyte, and
a difference in battery capacity, a difference in a battery use voltage range, a difference in a range of charge rate or a difference in a range in discharge rate, and
wherein the BMS is further configured to increase a time index of said Extended Kalman Filter algorithm in response to a continued charging or discharging of the hybrid secondary battery.

2. The apparatus of claim 1, wherein the state parameter further includes at least one of:
a voltage formed by a first impedance element included in the first circuit unit; and
a voltage formed a second impedance element included in the second circuit unit.

3. The apparatus of claim 2, wherein the state equation is defined such that the voltage formed by the at least one impedance element varies according to time, by an impedance voltage formula derived from circuit analysis of the at least one impedance element included in the first circuit unit and the second circuit unit, respectively, and
the BMS time-updates the voltage formed by each impedance element, by implementing [state estimate time update] of the Extended Kalman Filter algorithm, by using the state equation.

4. The apparatus of claim 1, wherein the state equation includes, as an input parameter, a first current flowing through the first circuit unit, and a second current flowing through the second circuit unit, and the BMS determines the first current and the second current, by using a current distribution equation derived from the circuit model, and the current measured by the sensor unit.

5. The apparatus of claim 1, wherein the output equation is derived from voltage analysis of the circuit model, and includes a plurality of input parameters, and the plurality of input parameters include a current measured by the sensor unit.

6. The apparatus of claim 1, wherein the state equation is defined such that the first state of charge and the second state of charge are determined by adding up currents flowing through the first circuit unit and the second circuit unit according to time, respectively, and
the BMS time-updates the first state of charge and the second state of charge, by implementing [state estimate time update] of the Extended Kalman Filter algorithm, by using the state equation.

7. The apparatus of claim 1, wherein the BMS implements [error covariance time update] of the Extended Kalman Filter algorithm, by using Jacobian matrix derived from the state equation.

8. The apparatus of claim 7, wherein the BMS estimates the operating voltage of the hybrid secondary battery, by implementing [output estimate] of the Extended Kalman Filter algorithm, by using the output equation.

9. The apparatus of claim 8, wherein the BMS implements [Kalman gain determination] of the Extended Kalman Filter algorithm, by using Jacobian matrix derived from the output equation and the time-updated error covariance.

10. The apparatus of claim 9, wherein the BMS implements [state estimate measurement update] of the Extended Kalman Filter algorithm, by reflecting the determined Kalman gain to a difference between the measured operating voltage and the estimated operating voltage.

11. The apparatus of claim 10, wherein the BMS implements [error covariance measurement update] of the Extended Kalman Filter algorithm, by using the time-updated error covariance and the determined Kalman gain.

12. The apparatus of claim 1, wherein the state equation includes a process noise, and the output equation includes a sensor noise.

13. The apparatus of claim 1, wherein the impedance element included in the first circuit unit or the second circuit unit includes at least one resistor, at least one capacitor, at least one inductor or a combination thereof.

14. The apparatus of claim 13, wherein the impedance element includes:
a plurality of RC circuits, each RC circuit including a first resistor and a capacitor connected in parallel; and
a second resistor connected in series with each RC circuit.

15. An electrically-driven apparatus comprising the apparatus as defined in claim 1.

16. The apparatus of claim 1, wherein the output equation is as follows:

$$V[k] = \frac{\left(OCV_{c1}(z_{c1}[k]) + \sum_n V_{RC,c1}^n[k]\right)R_{0,c2} + \left(OCV_{c2}(z_{c2}[k]) + \sum_m V_{RC,c2}^m[k]\right)R_{0,c1} + I[k]R_{0,c1}R_{0,c2}}{R_{0,c1} + R_{0,c2}} + v[k],$$

where V[k] operating voltage of the hybrid secondary battery, I[k] is the operating current of the hybrid secondary battery, $OCV_{c1}(z_{c1})$ is the first open-circuit voltage based on a pre-defined correlation between the first state of charge $z_{c1}$ and the corresponding open-circuit voltage of the first secondary battery, $OCV_{c2}(z_{c2})$ is the second open-circuit voltage based on a pre-defined correlation between the second state of charge $z_{c1}$ and the corresponding open-circuit voltage of the second secondary battery, $RC_{n,c1}$ are first RC circuits, $RC_{n,c2}$ are second RC circuits, $R_{0,c1}$ are resistors connected to the first RC circuits $RC_{n,c1}$, $R_{v,c2}$ are resistors connected to the second RC circuits, $$\sum_n V_{RC,c1}^n[k]$$

denotes a sum of voltages formed by the first RC circuits $RC_{n,c1}$ and $$\sum_m V_{RC,c2}^m[k]$$

denotes a sum of voltages formed by the second RC circuits $RC_{n,c2}$.

17. The apparatus of claim 1, wherein the output equation is derived from voltage analysis of the circuit model, and includes a plurality of input parameters, and the plurality of input parameters further include:
an impedance voltage of the first circuit unit; and
an impedance voltage of the second circuit unit.

18. A method for estimating state of a hybrid secondary battery, wherein the hybrid secondary battery comprises a first secondary battery and a second secondary battery having different electrochemical characteristics from each other and being connected in parallel with each other, the method comprising:
measuring, at time intervals, an operating voltage and an operating current of the hybrid secondary battery;
estimating the state of the hybrid secondary battery via a battery management system (BMS), wherein the state comprises at least one of a first state of charge of the first secondary battery and a second state of charge of the second secondary battery, by implementing an Extended Kalman Filter algorithm using a state equation and an output equation, wherein the state equation comprises, as a state parameter, the first state of charge of the first secondary battery and the second state of charge of the second secondary battery, and the output equation comprises, as an output parameter, the operating voltage of the hybrid secondary battery,
wherein the state equation and the output equation are derived from a circuit model, and the circuit model comprises a first circuit unit comprising a first open-circuit voltage element corresponding to the first secondary battery connected in series with a first impedance element corresponding to the first secondary battery, and a second circuit unit connected in parallel with the first circuit unit, and comprising a second open-circuit voltage element corresponding to the second secondary battery connected in series with a second impedance element corresponding to the second secondary battery, and
initiating, via the BMS, the charging and discharging of the hybrid secondary battery based on the estimated state of the hybrid secondary battery,
wherein the different electrochemical characteristics include:
a difference in a positive electrode material, a difference in a negative electrode material, or a difference in an electrolyte, and
a difference in battery capacity, a difference in a battery use voltage range, a difference in a range of charge rate or a difference in a range in discharge rate,
wherein the first open-circuit voltage element varies voltage according to the state of charge of the first secondary battery,
wherein the second open-circuit voltage element varies voltage according to the state of charge of the second secondary battery, and
wherein the BMS is further configured to increase a time index of said Extended Kalman Filter algorithm in response to a continued charging or discharging of the hybrid secondary battery.

19. The method of claim 17, further including storing, transmitting, or displaying the estimated state of charge of the hybrid secondary battery.

20. The method of claim 17, wherein the Extended Kalman Filter algorithm includes:
state estimate time update;
error covariance time update;
output estimation;
Kalman gain determination;
state estimate measurement update; and
error covariance measurement update.

21. A computer-readable recording medium recording therein a program for implementing the method as defined in claim 18.

22. The method of claim 18, wherein the output equation is as follows:

$$V[k] = \frac{\left(OCV_{c1}(z_{c1}[k]) + \sum_n V_{RC,c1}^n[k]\right)R_{0,c2} + \left(OCV_{c2}(z_{c2}[k]) + \sum_m V_{RC,c2}^m[k]\right)R_{0,c1} + I[k]R_{0,c1}R_{0,c2}}{R_{0,c1} + R_{0,c2}} + v[k]$$

where V[k] operating voltage of the hybrid secondary battery, I[k] is the operating current of the hybrid secondary battery, $OCV_{c1}(z_{c1})$ is the first open-circuit voltage based on a pre-defined correlation between the first state of charge $z_{c1}$ and the corresponding open-circuit voltage of the first secondary battery, $OCV_{c2}(z_{c2})$ is the second open-circuit voltage based on a pre-defined correlation between the second state of charge $z_{c1}$ and the corresponding open-circuit voltage of the second secondary battery, $RC_{n,c1}$ are first RC circuits, $RC_{n,c2}$ are second RC circuits, $R_{0,c1}$ are resistors connected to the first RC circuits $RC_n$c1, $R_{0,c2}$ are resistors connected to the second RC circuits, $$\sum_n V_{RC,c1}^n[k]$$

denotes a sum of voltages formed by the first RC circuits $RC_{n,c1}$ and $$\sum_m V_{RC,c2}^m[k]$$

denotes a sum of voltages formed by the second RC circuits $RC_{n,c2}$.

\* \* \* \* \*